US006765259B2

(12) United States Patent
Kim

(10) Patent No.: US 6,765,259 B2
(45) Date of Patent: Jul. 20, 2004

(54) NON-VOLATILE MEMORY TRANSISTOR ARRAY IMPLEMENTING "H" SHAPED SOURCE/DRAIN REGIONS AND METHOD FOR FABRICATING SAME

(75) Inventor: Jongoh Kim, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 94 days.

(21) Appl. No.: 10/233,310

(22) Filed: Aug. 28, 2002

(65) Prior Publication Data

US 2004/0041199 A1 Mar. 4, 2004

(51) Int. Cl.[7] .......................................... H01L 29/788
(52) U.S. Cl. ...................................... 257/315; 257/316
(58) Field of Search ................................. 257/315, 316

(56) References Cited

U.S. PATENT DOCUMENTS

| 4,839,705 A | * | 6/1989 | Tigelaar et al. ........ 365/185.16 |
| 5,148,246 A | * | 9/1992 | Ema ........................... 257/316 |
| 5,768,192 A | | 6/1998 | Eitan |
| 5,804,854 A | | 9/1998 | Jung et al. |
| 5,982,671 A | | 11/1999 | Kang et al. |
| 6,181,597 B1 | | 1/2001 | Nachumovsky |
| 6,346,442 B1 | | 2/2002 | Aloni et al. |

* cited by examiner

Primary Examiner—David Nelms
Assistant Examiner—Tu-Tu Ho
(74) Attorney, Agent, or Firm—Bever, Hoffman & Harms, LLP; E. Eric Hoffman

(57) ABSTRACT

A non-volatile memory (NVM) array including a plurality of 2-bit NVM transistors arranged in a plurality of rows extending along a first axis, and a plurality of columns extending along a second axis, perpendicular to the first axis. The non-volatile memory array includes a plurality of field isolation regions located in a semiconductor substrate and a plurality of word lines extending over the semiconductor substrate along the first axis, wherein the word lines form control gates of the 2-bit NVM transistors. Oxide-nitride-oxide (ONO) structures are formed between the substrate and the word lines, wherein the nitride layer provides floating gate storage for the NVM transistors. A plurality of H-shaped source/drain regions are defined by the field isolation regions and the word lines, wherein each source/drain region serves as a source/drain for four different NVM transistors in the array.

17 Claims, 15 Drawing Sheets

NON-VOLATILE MEMORY TRANSISTOR ARRAY IMPLEMENTING "H" SHAPED SOURCE/DRAIN REGIONS AND METHOD FOR FABRICATING SAME

FIELD OF THE INVENTION

The present invention relates to non-volatile memory transistors. More specifically, the present invention relates to a method and structure of using a 2-bit non-volatile memory transistor to form a flash memory transistor array.

RELATED ART

A 2-bit non-volatile semiconductor memory transistor has been described in U.S. Pat. No. 5,768,192, to Eitan. However, the manners of using 2-bit NVM transistors in a memory array have not yet been fully developed.

One memory array that implements 2-bit NVM transistors is described in U.S. Pat. No. 6,181,597 to Nachumovsky.

FIG. 1 is a schematic diagram illustrating a conventional memory block 100. Memory block 100 implements uses a plurality of 2-bit memory transistors, which are identified as memory transistors $M_{X,Y}$, where X and Y represent the row and column locations, respectively, of the memory transistors within memory block 100. Thus, memory block 100 includes memory transistors $M_{0,0}$–$M_{3,6}$. The rows extend along a first axis, and the columns extend along a second axis, perpendicular to the first axis.

Each of the memory transistors $M_{0,0}$–$M_{3,6}$ includes two charge trapping regions, namely, a left charge trapping region and a right charge trapping region, thereby enabling each of memory transistors $M_{0,0}$–$M_{3,6}$ to store 2-bits of data.

The source and drain regions of memory transistors $M_{0,0}$–$M_{3,6}$ are formed by diffused regions 101–108, which extend in parallel along the second axis. Diffused regions 101–108 also operate as bit lines within memory block 100. Thus, diffused regions 101–108 are referred to as diffusion bit lines.

ONO structures 111–117 are located between adjacent diffusion bit lines 101–108, as illustrated. The gates of the memory transistors in each row are commonly connected to a word line. More specifically, the memory transistors of rows 0–3 are connected to word lines $WL_0$–$WL_3$, respectively.

The 2-bit memory transistors of memory block 100 are accessed through high-voltage select transistors 131–138 and metal bit lines 141–144. Metal bit lines 141–144 are located in an interconnect layer that extends over the above-described elements of memory block 100. High-voltage select transistors 131–138 are designed to have gate oxide sufficient to withstand the high voltages required for programming and erasing the memory transistors. In general, select transistors 131–138 are controlled to selectively connect metal bit lines 141–144 to diffusion bit lines 101–108.

FIG. 2 is a cross sectional view of memory transistors $M_{0,0}$ and $M_{0,1}$ along the first axis through word line $WL_0$. Diffusion bit lines 101–103 are n-type regions formed in a p-type silicon semiconductor region 110. Bit line oxide regions 124 are formed over the diffusion bit lines 101–103. Because the memory transistors in memory block 100 do not require field oxide for isolation, memory block 100 can be referred to as a fieldless array. ONO structures 111 and 112 extend over bit line insulating regions 124, diffusion bit lines 101–103 and substrate 110 in the manner illustrated. Word line $WL_0$ is a polycide or salicide structure that includes a layer of conductively doped polycrystalline silicon 126 and an overlying layer of metal silicide 127, and extends over ONO structures 111 and 112 (and bit line insulating regions 124). Word lines $WL_0$ forms the control gate of memory transistors $M_{0,0}$ and $M_{0,1}$. The fabrication of memory block 100 is described in U.S. Pat. No. 6,346,442 by Aloni et al.

Typical problems associated with memory block 100 and the corresponding memory transistors include (1) relatively large source/drain series resistances due to the use of diffusion bit lines, (2) relatively deep source/drain junction depths due to the high thermal budget required by bit line oxidate regions, (3) an unadaptable structure with respect to advanced CMOS technology using self-aligned salicidation process (i.e., almost impossible to implement self-aligned salicide on word lines and source/drain regions), and (4) high bit line-to-bit line leakage, because the memory transistors are separated by active regions, without any general isolation structure.

It would therefore be desirable to have a flash memory array structure that implements 2-bit non-volatile memory transistors and exhibits a relatively low source/drain series resistance, and a relatively low bit line resistance. It would further be desirable if the source/drain junction depth of the memory transistors in the array are relatively shallow (e.g., less than 0.1 microns). It would further be desirable if the flash memory array structure were capable of implementing a self-aligned salicidation process over both the gate and source/drain regions of the array. It would also be desirable if there were no leakage issues between bit lines of the flash memory array. It would further be desirable if the flash memory array exhibits low word line capacitance, thereby resulting in low RC delay and high-speed operation.

SUMMARY

Accordingly, the present invention provides an improved array structure for implementing a flash memory array using 2-bit non-volatile memory transistors. For purposes of this disclosure, a flash memory array is defined as a non-volatile memory array that cannot be erased on a word-by-word basis, but which must be erased in blocks. The present invention also provides a method for fabricating this improved array structure, which is largely compatible with a conventional CMOS process flow.

In accordance with one embodiment, a non-volatile memory (NVM) array is fabricated with a plurality of 2-bit NVM transistors arranged in a plurality of rows extending along a first axis, and a plurality of columns extending along a second axis, perpendicular to the first axis. The non-volatile memory array includes a plurality of field isolation regions located in a semiconductor substrate. In a preferred embodiment, the field isolation regions are shallow trench isolation (STI) regions.

A plurality of word lines extend over the semiconductor substrate along the first axis, wherein the word lines also form control gates of the 2-bit NVM transistors. Oxide-nitride-oxide (ONO) structures are located between the substrate and the word lines, wherein the nitride layer of the ONO structures provides floating gate storage for the NVM transistors. A plurality of H-shaped source/drain regions are defined by the field isolation regions and the word lines, wherein each source/drain region serves as a source/drain for four different NVM transistors in the array. Self-aligned silicide can be formed over both the word lines and the source/drain regions.

Because each source/drain region only serves as a source/drain region for four different NVM transistors (and not an entire diffusion bit line), the array structure of the present invention advantageously provides a low source/drain series resistance and relatively low bit line resistances.

The present invention also includes a method of fabricating an array of 2-bit NVM cells, wherein the method includes (1) forming a plurality of field isolation regions in a semiconductor substrate, (2) forming a lower dielectric layer over the semiconductor substrate, (3) forming a floating gate dielectric layer over the lower dielectric layer, (4) forming an upper dielectric layer over the floating gate dielectric layer, (5) forming a gate electrode layer over the upper dielectric layer, (6) patterning the gate electrode layer, the upper dielectric layer and the floating gate dielectric layer, wherein the gate electrode layer is patterned to form a plurality of word line/control gate structures extending along a first axis, and wherein the floating gate dielectric layer is patterned to form a plurality of floating gate structures, and (7) forming H-shaped source/drain regions having a first conductivity type in the substrate, the H-shaped source/drain regions being defined by the word line/control gate structures and field isolation regions.

In one embodiment, the lower dielectric layer is formed by thermally oxidizing the upper surface of the substrate. The floating gate dielectric layer can be formed by depositing a silicon nitride layer over the lower dielectric layer. The upper dielectric layer can be formed by thermally oxidizing the upper surface of the floating gate dielectric layer and/or depositing a silicon oxide layer over the floating gate dielectric layer.

The gate electrode layer can be formed by depositing a polysilicon layer over the upper dielectric layer. The polysilicon layer can be doped to the first conductivity type or a second conductivity type, opposite the first conductivity type. A refractory metal layer or a metal silicide layer can be deposited over the polysilicon layer, thereby forming a polycide gate electrode. In another embodiment, self-aligned salicide regions are formed over both the word line/control gate structures and the source/drain regions.

The source/drain regions are fabricated in accordance with conventional processing techniques, and are not required to extend under bit line oxidation in the manner illustrated in FIG. 2 above. As a result, the source/drain junction depth of the NVM transistors in the array are advantageously relatively shallow.

The present invention will be more fully understood in view of the following description and drawings.

DETAILED DESCRIPTION

Figure 1:
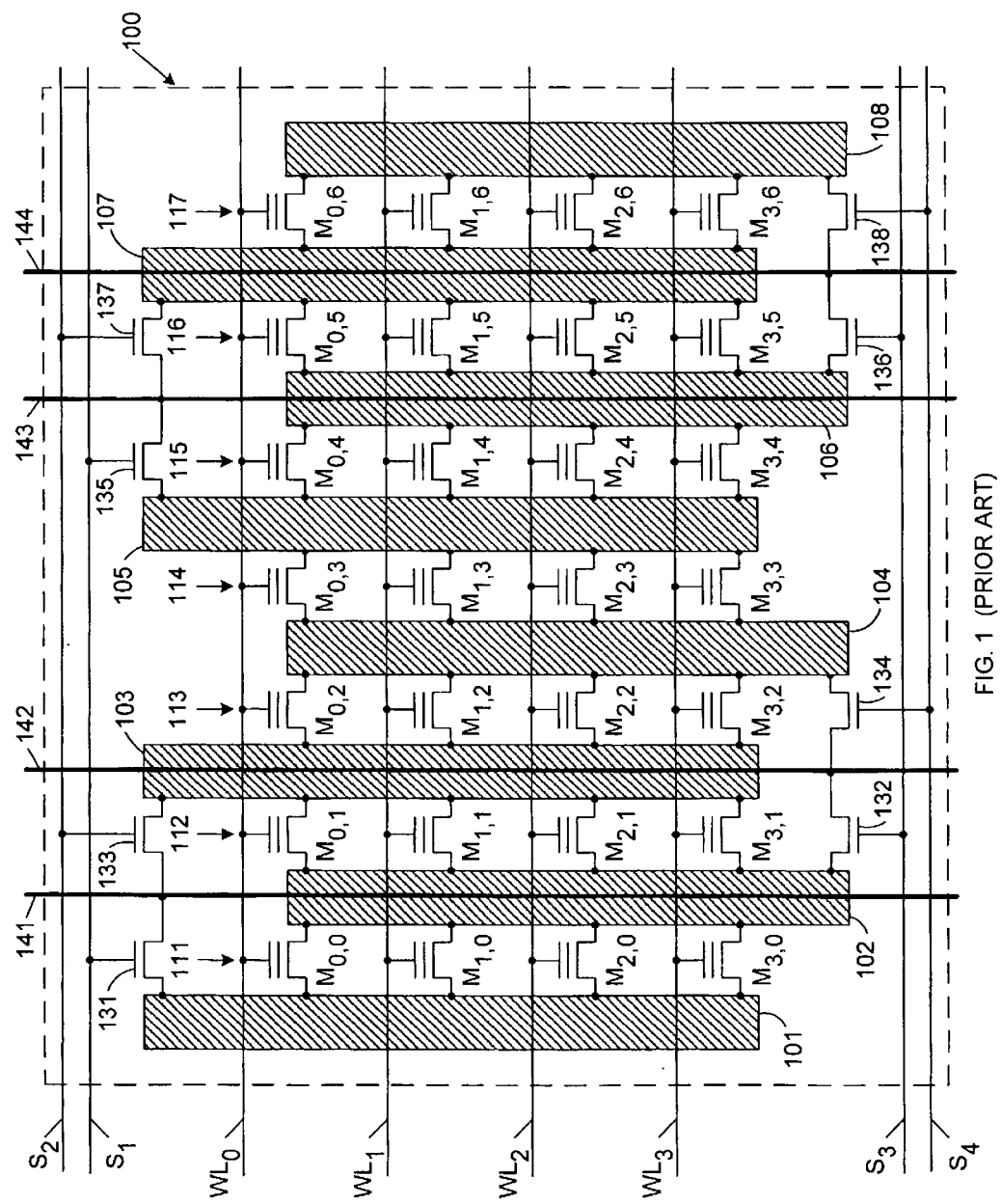
FIG. 1 is a circuit diagram of a conventional memory block that uses 2-bit non-volatile memory transistors.
Figure 2:
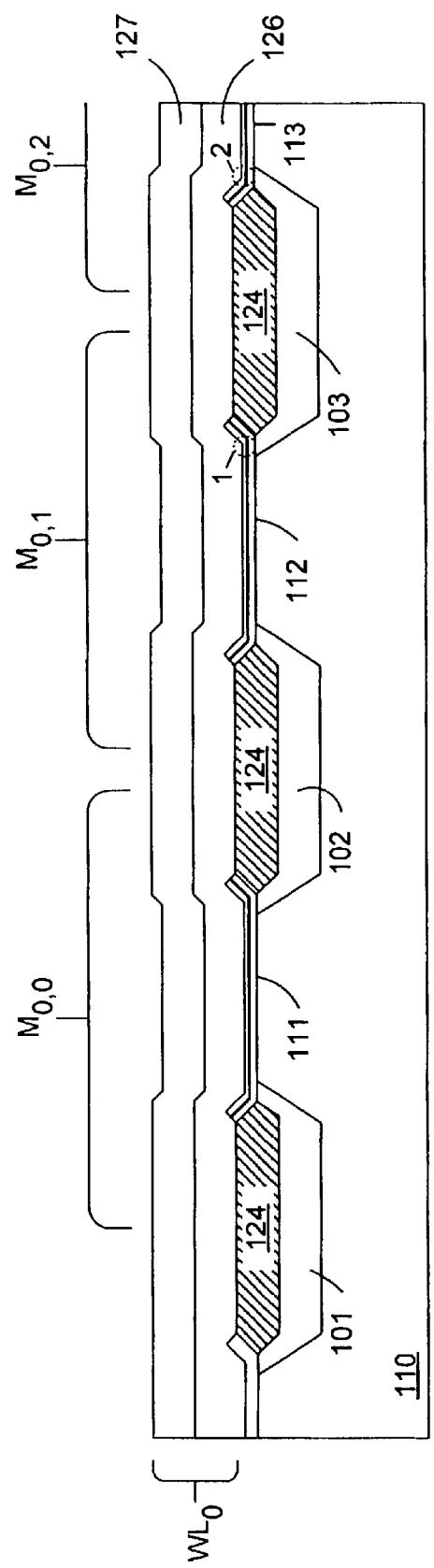
FIG. 2 is a cross sectional view of selected memory transistors of FIG. 1, taken along a word line.
Figure 3:
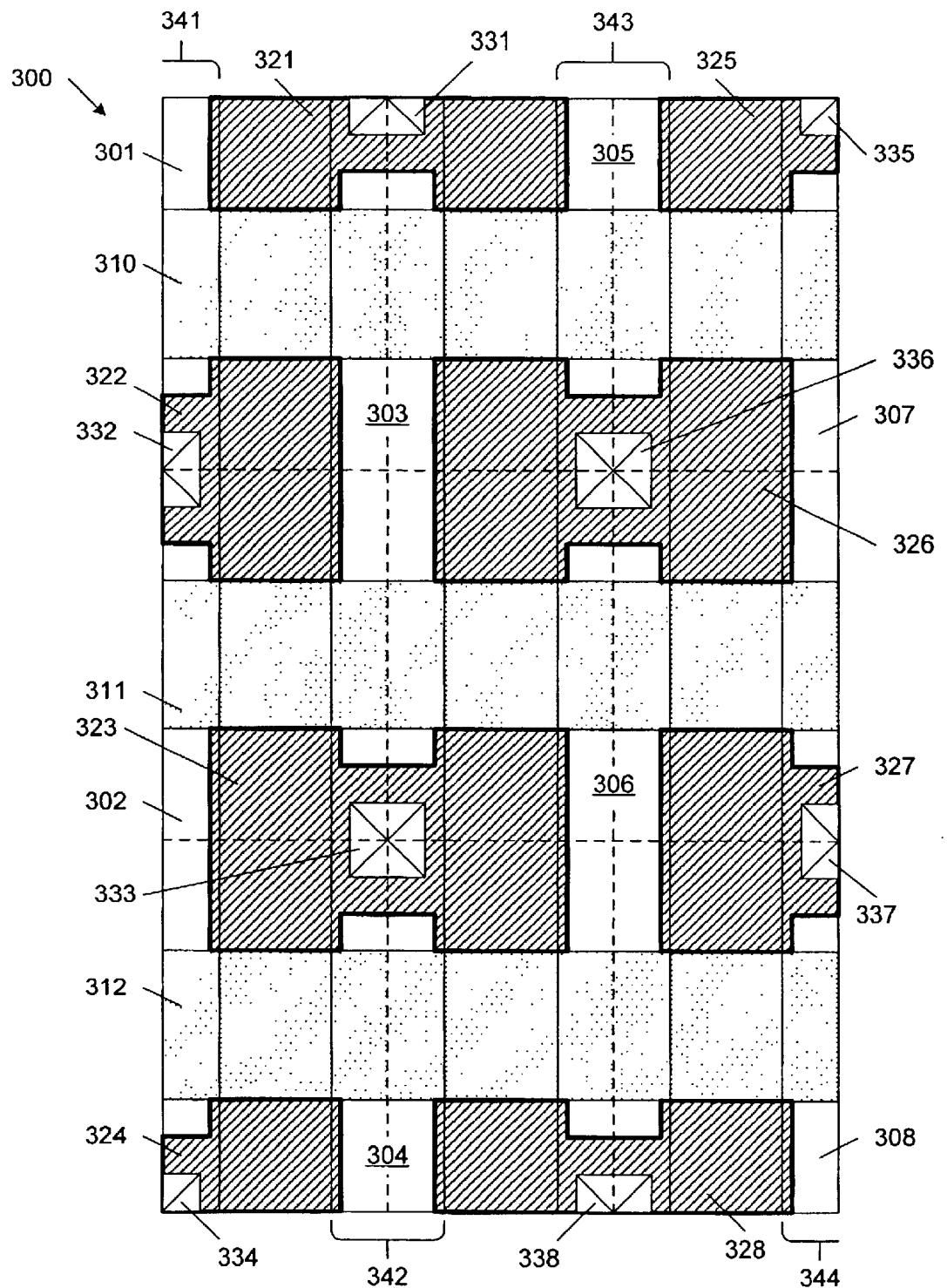
FIG. 3 is a layout diagram of a portion of a non-volatile memory transistor array that implements "H"-shaped source/drain regions in accordance with one embodiment of the present invention.

FIG. 3 is a layout diagram of a portion of a non-volatile memory transistor array 300 that implements "H"-shaped source/drain regions in accordance with one embodiment of the present invention. The illustrated portion of array 300 includes field isolation regions 301–308, control gate/word lines 310–312, source/drain regions 321–328, bit line contacts 331–338, and bit lines 341–344. The memory transistor boundaries are defined by dashed lines in FIG. 3. Each of the memory transistors also includes a channel region and a floating gate region, which are not explicitly shown in FIG. 3.

Figure 4A:
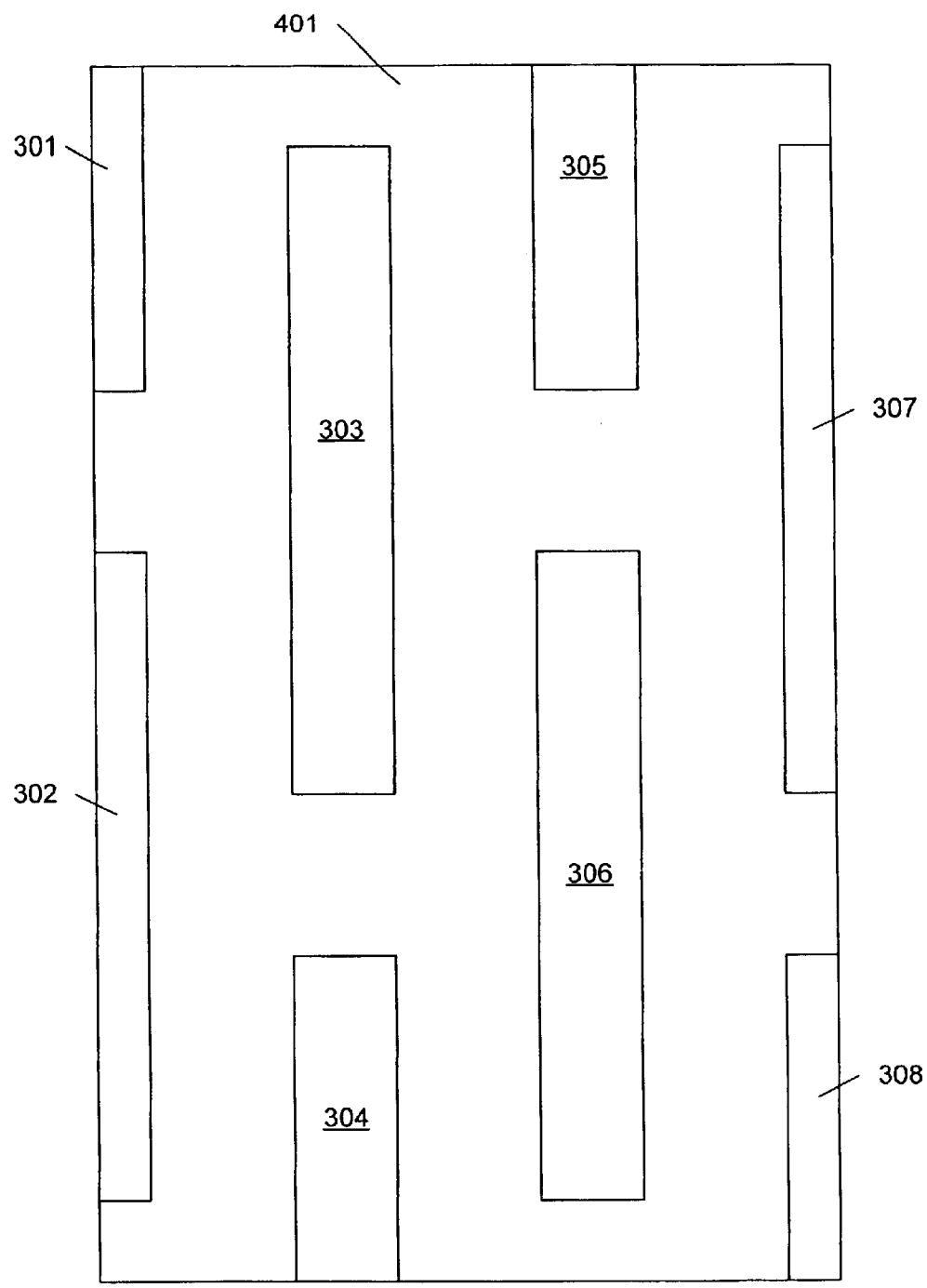
FIGS. 4A–4D are layout diagrams illustrating the array of FIG. 3 during various stages of fabrication.

FIGS. 4A–4D illustrate array 300 during various stages of fabrication, thereby clarifying the structure of FIG. 3. As illustrated in FIG. 4A, field isolation regions 301–308 are initially formed in semiconductor region 401. As described in more detail below, field isolation regions 301–308 are preferably shallow trench isolation (STI) regions, but can also be conventional oxide regions formed by the local oxidation of silicon (LOCOS).

Figure 4B:
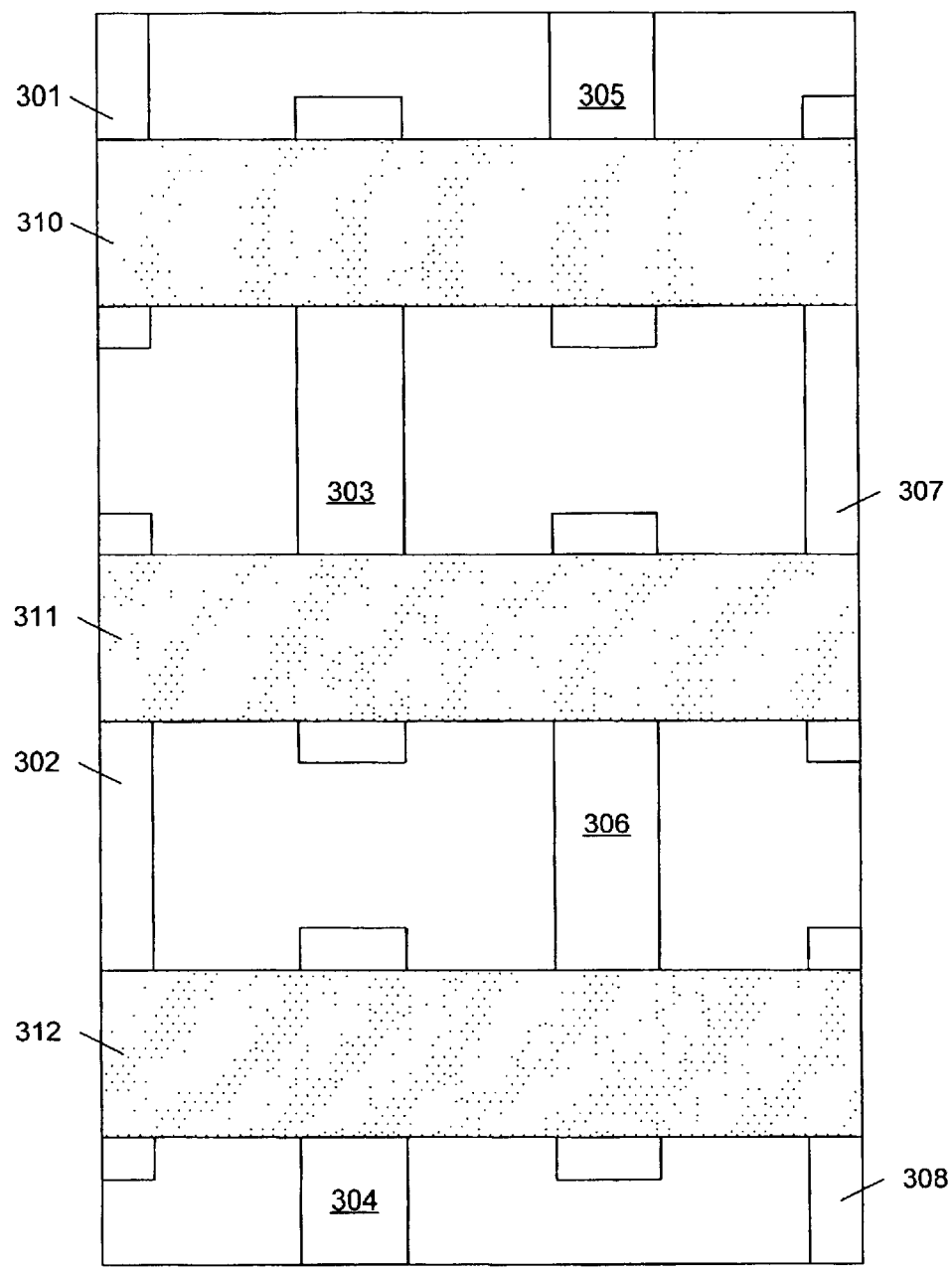

As illustrated in FIG. 4B, control gate/word lines 310–312 are subsequently formed over the structure of FIG. 4A. As described in more detail below, oxide-nitride-oxide (ONO) structures are formed under control gate/word lines 310–312. These ONO structures form floating gate regions of the resulting 2-bit non-volatile memory transistors.

Figure 4C:
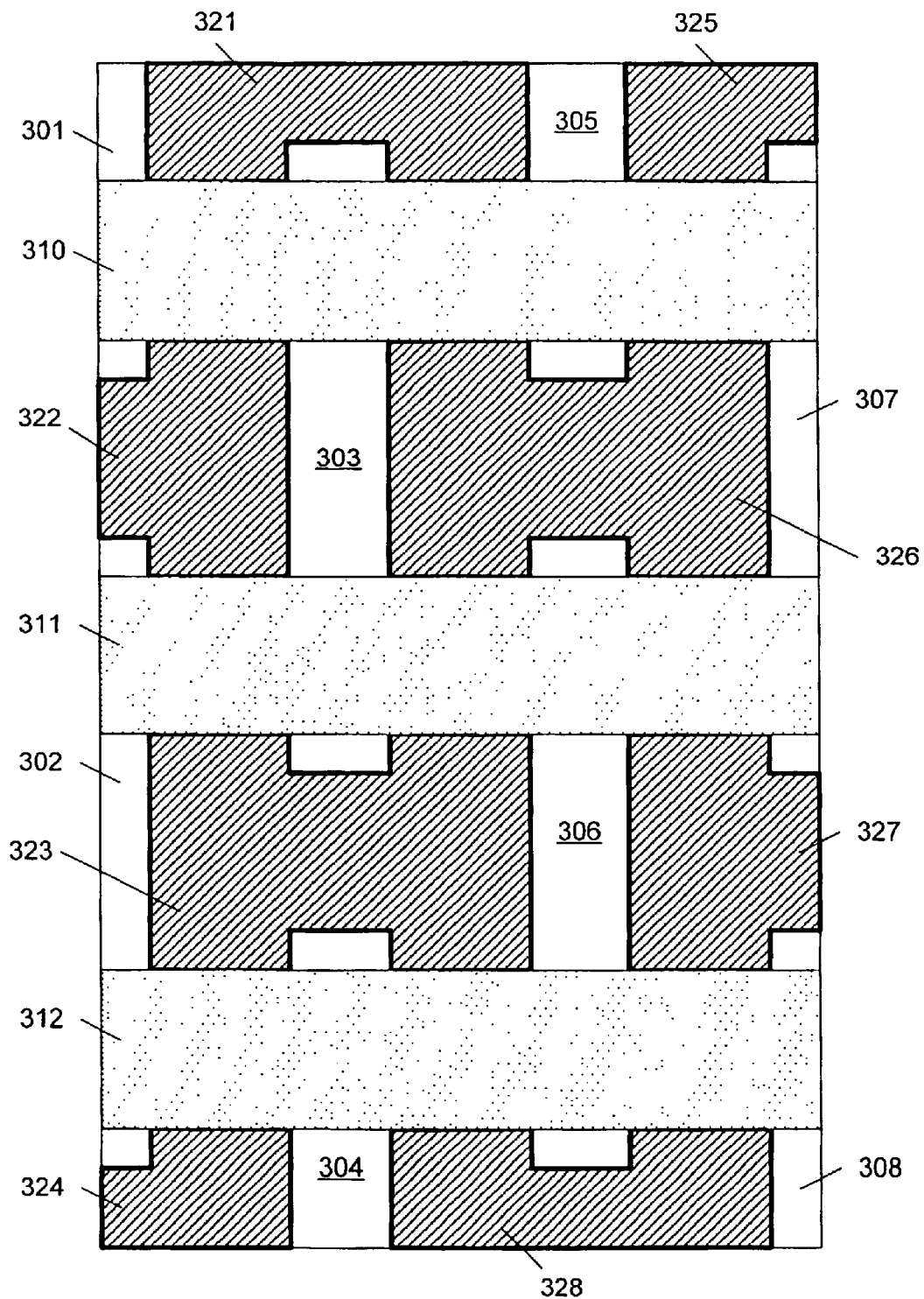

As illustrated in FIG. 4C, the source/drain regions 321–328 are then formed in substrate region 401. Source/drain regions 321–328 are formed in a self-aligned manner with respect to the control gate/word lines 310–312 and field isolation regions 301–308. The fabrication of source/drain regions 321–328 is described in more detail below.

Figure 4D:
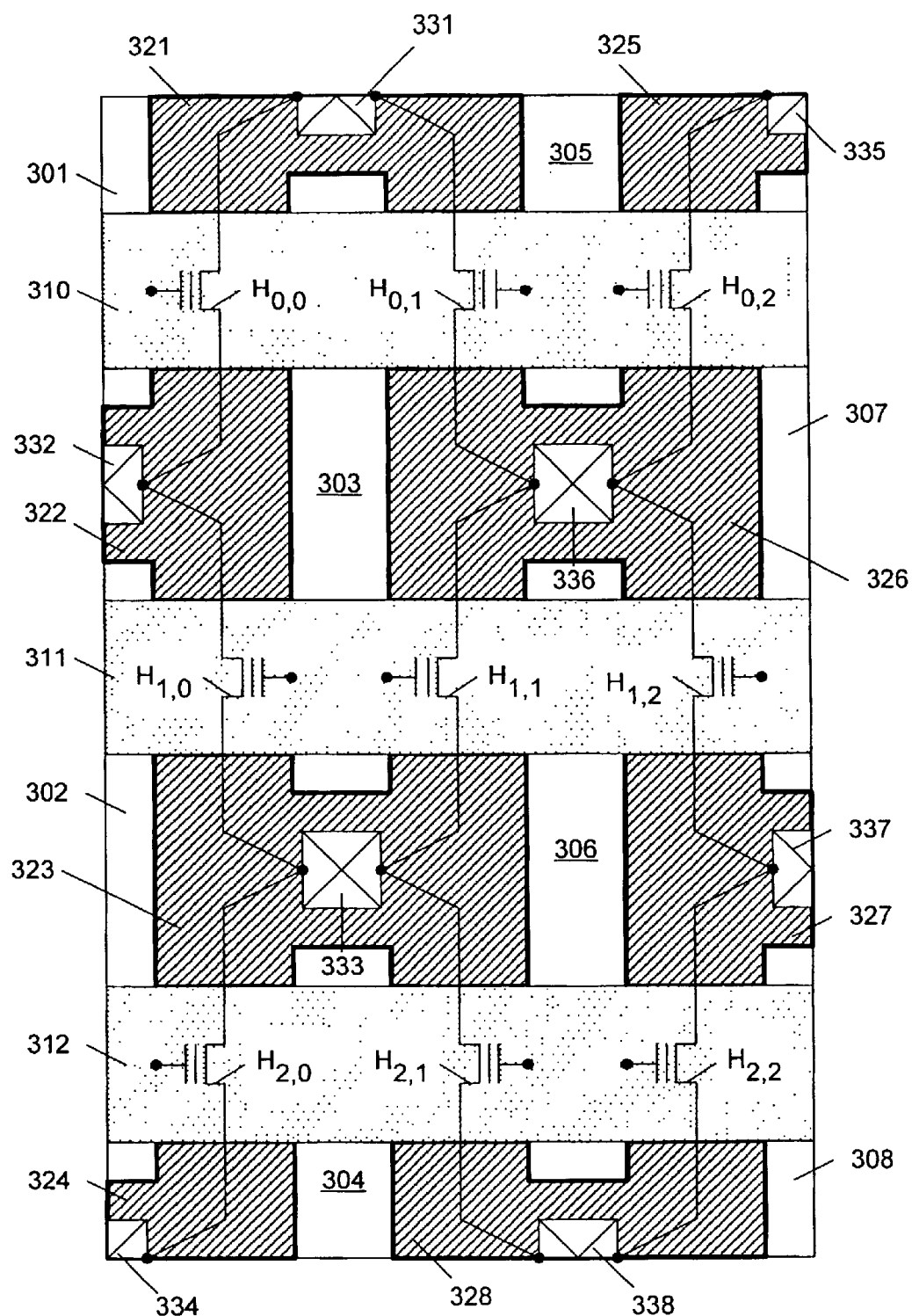

As illustrated in FIG. 4D, the source/drain contacts 331–338 are subsequently formed, thereby providing connections to source/drain regions 321–328, respectively. Bit lines 341–344 are subsequently formed as illustrated in FIG. 3. Bit line 341 is connected to contacts 332 and 333; bit line 342 is connected to contacts 331 and 333; bit line 343 is connected to contacts 336 and 338; and bit line 344 is connected to contacts 335 and 337. The 2-bit non-volatile memory transistors formed by the illustrated portion of array 300, are shown schematically in FIG. 4D as non-volatile memory transistors $H_{0,0}$ to $H_{2,2}$.

Figure 5:
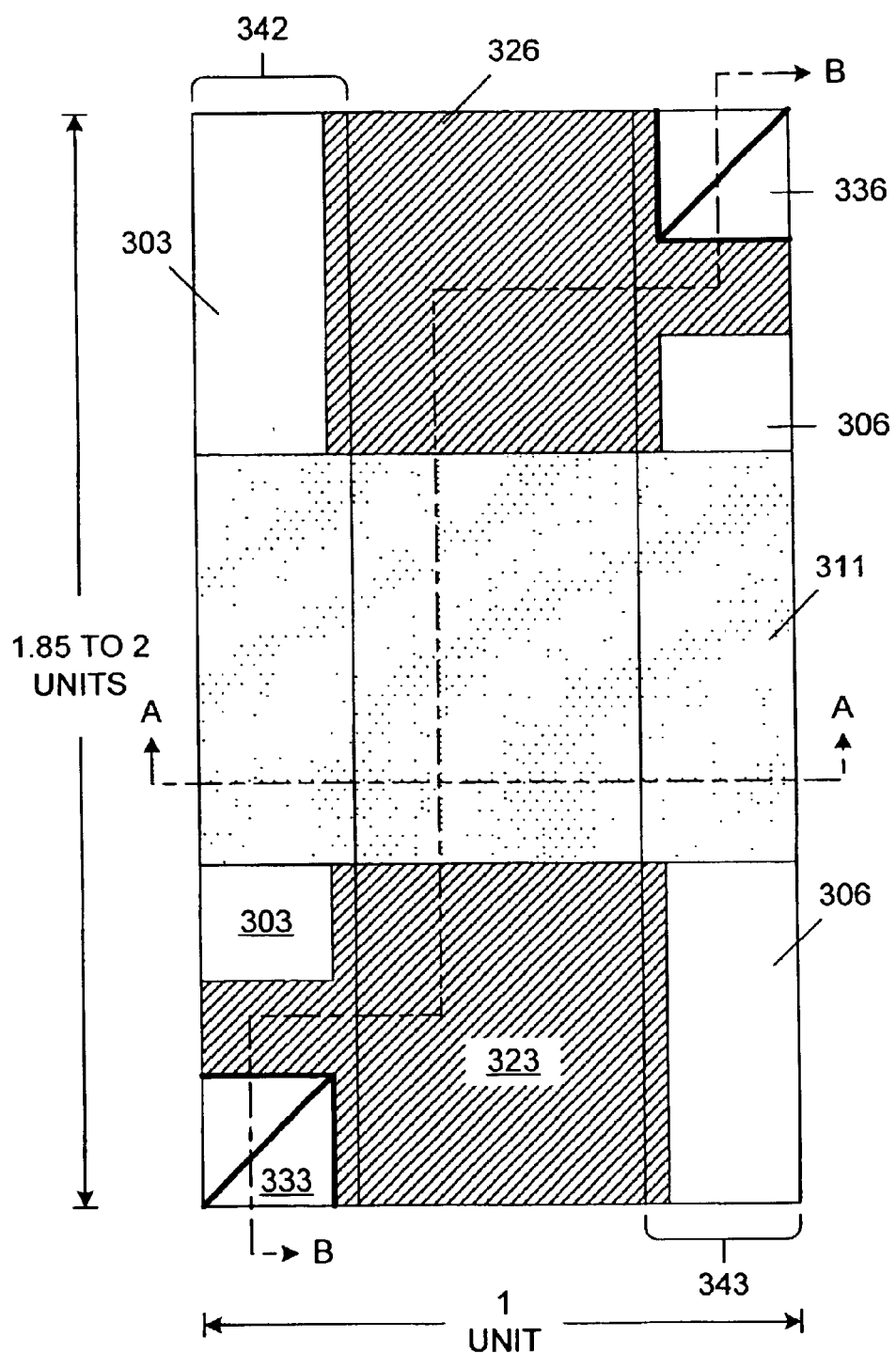
FIG. 5 is detailed layout diagram of a single non-volatile memory transistor in the array of FIG. 3 in accordance with one embodiment of the present invention.

FIG. 5 is a more detailed view of the layout of non-volatile memory transistor $H_{1,1}$ in accordance with one embodiment of the present invention. This example assumes that the memory array 300 is fabricated largely in accordance with a conventional 0.35 micron CMOS process flow, with the modifications described below. In the described example, memory transistor $H_{1,1}$ exhibits a length-to-width ratio of about (1.85 to 2):1, and a layout area on the order of 0.465 microns$^2$. Because memory transistor $H_{1,1}$ is capable of storing 2-bits of data, the layout density of memory transistor $H_{1,1}$ in this example is about 0.2325 microns$^2$/bit. However, if memory transistor $H_{1,1}$ is fabricated using CMOS processes having smaller minimum line widths, the length-to-width ratio may be changed, and the layout area will be reduced.

Figure 6:
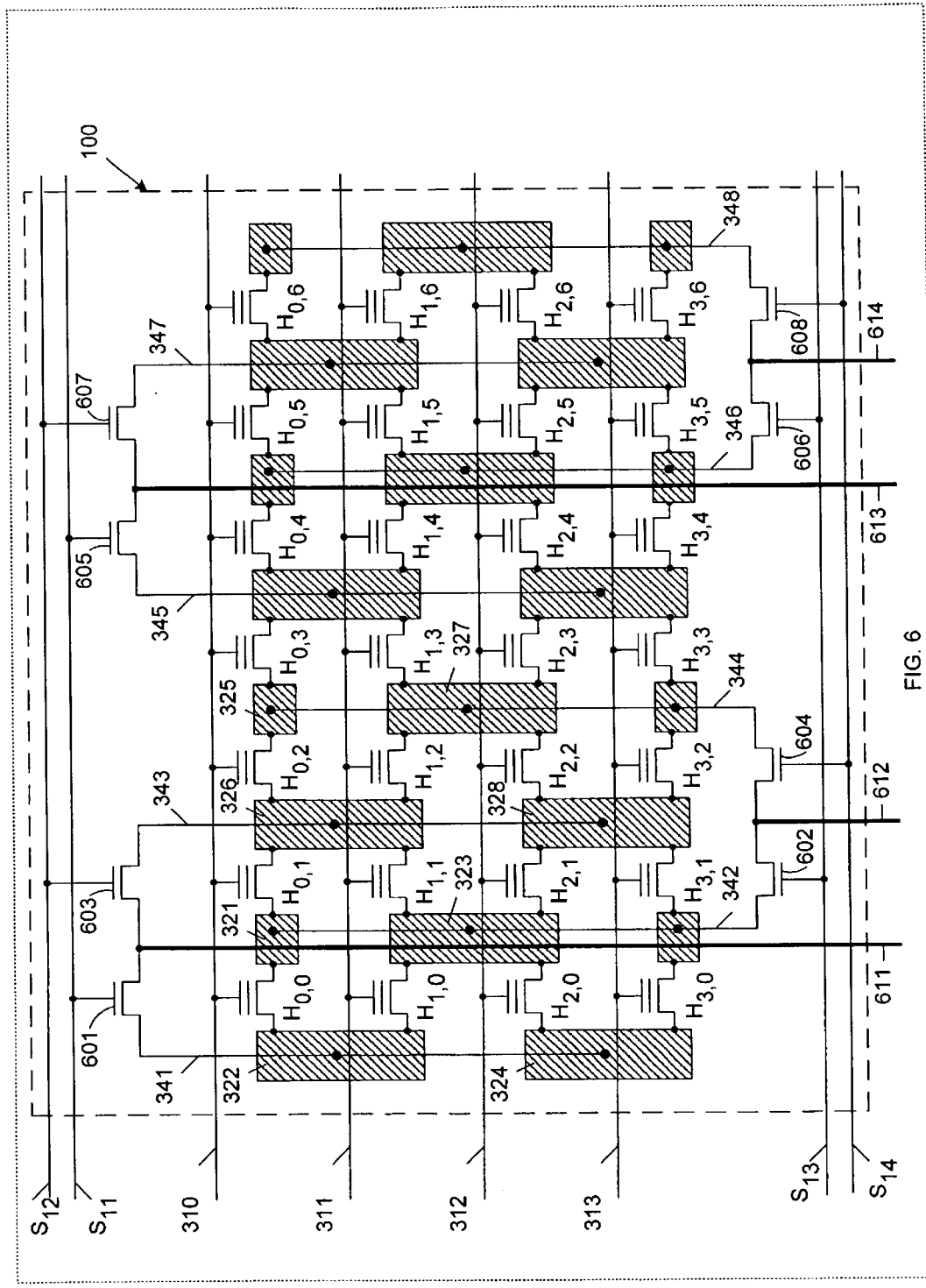
FIG. 6 is a circuit diagram of a larger portion of the memory transistor array of FIG. 3.

FIG. 6 is a circuit diagram of a larger portion of memory transistor array 300. Memory transistor array 300 implements memory transistors $H_{X,Y}$, where X and Y represent the row and column locations, respectively, of the memory transistors within memory transistor array 300. Thus, memory transistor array 300 includes memory transistors $H_{0,0}$–$H_{3,6}$ (with the layout of memory transistors $H_{0,0}$–$H_{2,2}$ being described above). The rows extend along a first axis, and the columns extend along a second axis, perpendicular to the first axis.

Advantageously, metal-1 bit lines 341–348 extend along the second axis of memory transistor array 300, thereby minimizing the bit line resistance. The low bit line resistance enables memory transistor array 300 to have a large number of columns, while maintaining high-speed access. For example, memory transistor array 300 can be extended to implement 1K (1024) or more rows.

Word lines 310–313 extend along the first axis in the manner described above. Although there are seven columns of memory transistors in the described embodiment, it is understood that other numbers of columns can be used in other embodiments. Additional columns can be added by repeating the pattern defined by memory transistor array 300.

The 2-bit memory transistors of memory block 100 are accessed through high-voltage select transistors 601–608 and metal-2 bit lines 611–614. Metal-2 bit lines 611–614 are located in an interconnect layer that extends over the above-described elements of memory transistor array 300. High-voltage select transistors 601–608 are designed to have gate oxide sufficient to withstand the high voltages required for programming and erasing the memory transistors. In general, select transistors 601–608 are controlled by select signals $S_{11}$–$S_{14}$ to selectively connect metal-2 bit lines 611–614 to metal-1 bit lines 341–348. Metal-2 bit lines 611–614 are connected to sense amplifiers and voltage sources during read, program and erase operations in a manner described in more detail below.

The memory transistors in memory transistor array 300 are accessed as follows. Two of the select lines $S_{11}$–$S_{14}$ are pulled high, thereby turning on the select transistors coupled to these two select lines, and two of the select lines $S_{11}$–$S_{14}$ are pulled low, thereby turning off the select transistors coupled to these two select lines. The turned on select transistors couple two columns of memory transistors to the metal-2 bit lines 611–614.

The fabrication of memory transistors will now be described. FIGS. 7, 8A, 9A and 10A are cross sectional views of memory transistor $H_{1,1}$ along section line A—A of FIG. 5, during various stages of fabrication. FIGS. 8B, 9B, 10B and 11–15 are cross sectional views of memory transistor $H_{1,1}$ along section line B—B of FIG. 5, during various stages of fabrication. The described process is a conventional CMOS twin-well process, except where otherwise noted.

Figure 7:
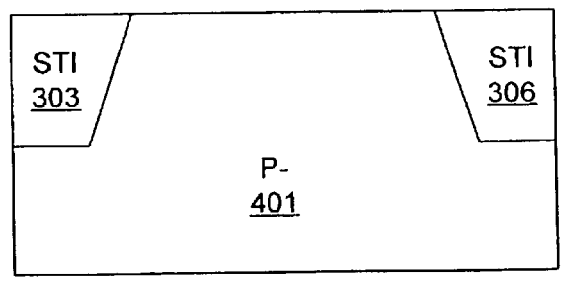
FIGS. 7, 8A, 9A and 10A are cross sectional views of the non-volatile memory transistor of FIG. 5, along section line A—A, during various stages of fabrication.

As illustrated in FIG. 7, the field isolation regions, including field isolation regions 303 and 306, are shallow trench isolation (STI) regions formed by conventional CMOS processing steps. More specifically, STI regions 301–308 are created by forming trenches in p-type semiconductor region 401, and filling the trenches with an insulating material, such as silicon oxide. STI regions 301–308 advantageously do not exhibit the bird's beak structure of LOCOS isolation regions. In the described example, STI regions 301–308 have a depth in the range of about 1500 to 5000 Å. In a non-preferred embodiment, field isolation regions 301–308 can be formed by a LOCOS process, however, the resultant cell size would be much larger.

After field isolation regions 301–308 are formed, a sacrificial oxide (not shown) is grown, and a p-type well implant and a threshold adjusting implant are performed through the sacrificial oxide. N-type well regions are then formed within the substrate. These well regions are not illustrated in the Figures for purposes of clarity. However, it is understood that memory transistor array 300 is fabricated in a p-type well region 401 in the described example. The sacrificial oxide is then removed.

Figure 8A:
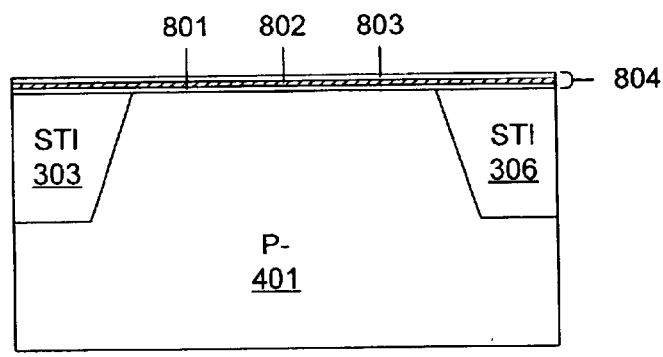
Figure 8B:
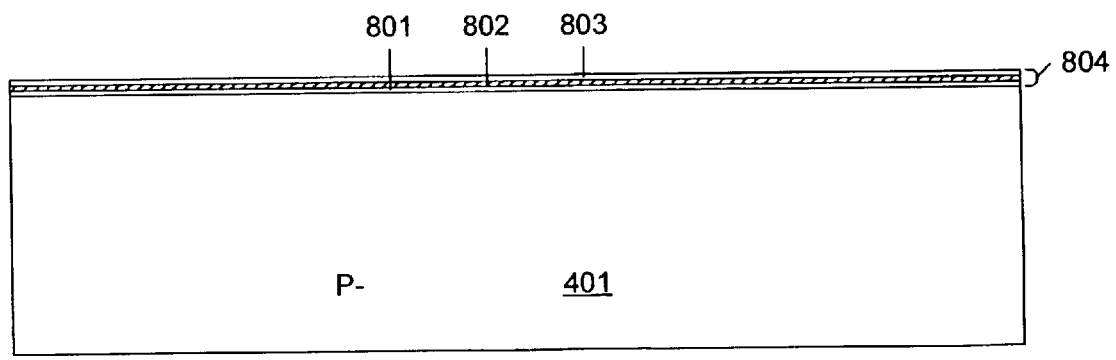
FIGS. 8B, 9B, 10B and 11–15 are cross sectional views the non-volatile memory transistor of FIG. 5, along section line B—B, during various stages of fabrication.

As illustrated in FIGS. 8A and 8B, after STI regions 301–308 have been formed, a lower dielectric layer 801 is deposited or created on the surface of p-well region 401. A floating gate layer 802 is then deposited on the upper surface of lower dielectric layer 801. Then, an upper dielectric layer 803 is either deposited or created on floating gate layer 802.

In the described embodiment, lower dielectric layer 801 is a layer of silicon oxide having a thickness in the range of about 10 to 150 Angstroms. In the described embodiment, lower dielectric layer 801 is created by thermally oxidizing the upper surface of semiconductor region 401 at a temperature in the range of 700 to 1300° C.

In the described embodiment, floating gate layer 802 is a layer of silicon nitride, deposited to a thickness of about 10 to 300 Angstroms over lower dielectric layer 801.

Upper dielectric layer 803 is a layer of silicon oxide in the described embodiment, whereby lower dielectric layer 801, floating gate layer 802 and upper dielectric layer 803 form an oxide-nitride-oxide (ONO) layer 804. The formation of ONO layer 804 is a departure from a conventional CMOS process flow. Upper dielectric layer 803 can be formed by thermal oxidation of the silicon nitride floating gate layer 802. Silicon nitride layer 802 is very stable layer and requires a high temperature in the presence of hydrogen and oxygen to create silicon oxide at a reasonable rate. In one embodiment, this high temperature is in the range 700 to 1300° C. In this embodiment, silicon nitride layer 802 is oxidized until the upper dielectric layer 803 has a thickness in the range of about 10 to 150 Angstroms. This silicon oxide layer promotes charge retention in silicon nitride layer 802 during operation. Oxidization of silicon nitride layer 802 reduces the thickness of silicon nitride layer 802 to approximately 10 to 150 Angstroms.

In one variation, upper dielectric layer 803 is formed by depositing a layer of silicon oxide over the silicon nitride floating gate layer 802 to a thickness of about 10 to 150 Angstroms (without oxidizing the upper surface of the silicon nitride floating gate layer 802). In another variation, upper dielectric layer 803 is formed by thermally oxidizing, nitric-oxidizing (e.g., with NO or $N_2O$), or nitrogen annealing the upper surface of the silicon nitride floating gate layer 802 at a temperature in the range of 600 to 1300° C., depositing a layer of silicon oxide over the resulting structure, and then thermally oxidizing, nitric-oxidizing (e.g., with NO or $N_2O$), or nitrogen annealing the upper surface of the resulting structure at a temperature in the range of 600 to 1300° C.

Figure 9A:
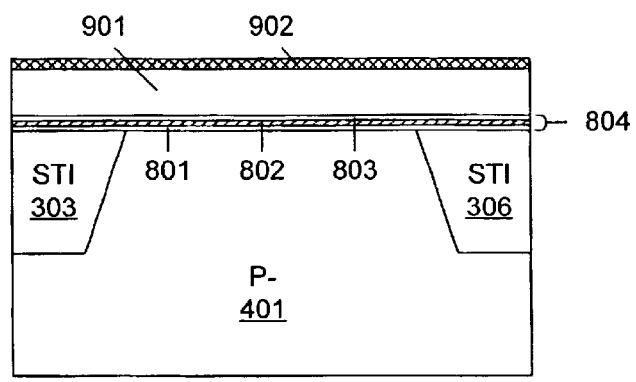
Figure 9B:
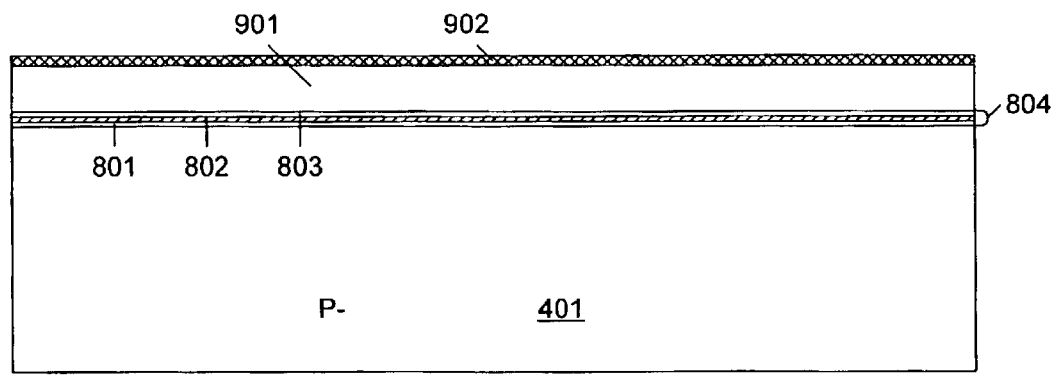

As illustrated in FIGS. 9A and 9B, a blanket layer of polysilicon 901 is then deposited over the upper surface of ONO structure 804. In some embodiments, phosphorus oxychloride ($POCl_3$) is used to dope polysilicon layer 901 to increase the conductivity of polysilicon layer 901. Other embodiments may implant impurities such as phosphorus and/or arsenic ions to increase the conductivity of polysilicon layer 901. In these embodiments, polysilicon layer 901 has an n-type conductivity. In one embodiment, polysilicon layer 901 is deposited to a thickness in the range of about 500 to 5000 Angstroms.

In yet another embodiment, polysilicon layer 901 can be doped with a p-type impurity, such as boron, thereby blocking electron injection from the resulting gate electrode 311 during normal operation of the resulting memory transistor $H_{1,1}$.

In accordance with the present embodiment, a metal silicide layer 902 is then formed over the upper surface of polysilicon layer 901. A layer of metal silicide, such as tungsten silicide, can be deposited directly on polysilicon layer 901 to form metal silicide layer 902. In an alternate embodiment, a blanket layer of a refractory metal, such as titanium or cobalt, is sputtered over the upper surface of polysilicon layer 901, and subsequently reacted with the underlying polysilicon layer 901, thereby forming metal silicide layer 902.

Figure 10A:
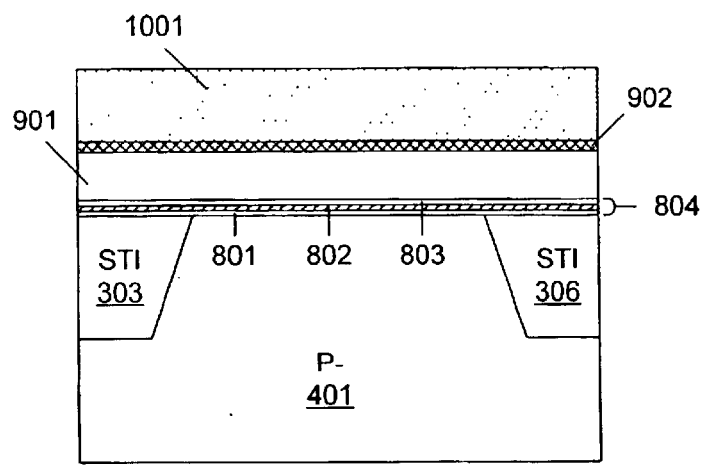
Figure 10B:
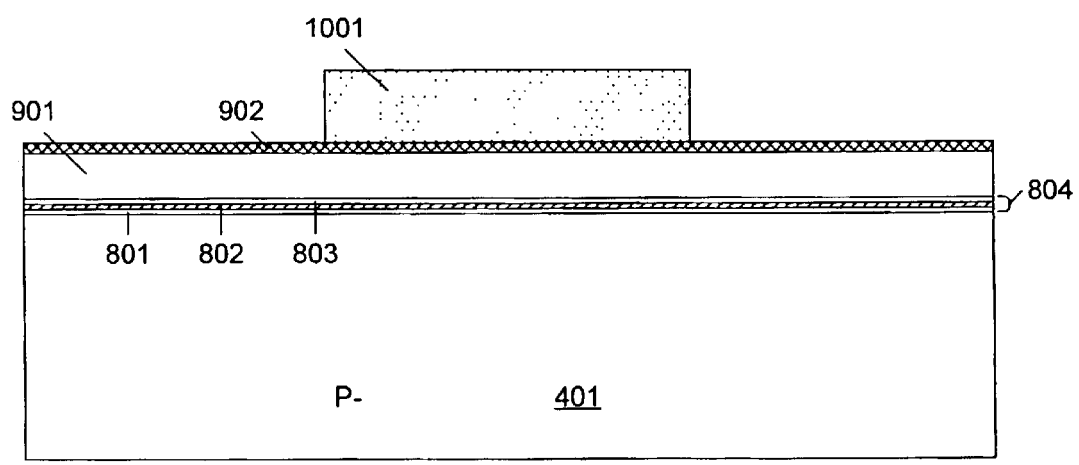

A layer of photoresist is then deposited over the resulting structure. This photoresist layer is exposed and developed to form photoresist mask 1001, as illustrated in FIGS. 10A and 10B. Photoresist mask 1001 is patterned to define the control gate/word line electrodes 311–314 of the non-volatile memory transistors $H_{0,0}$–$H_{3,6}$ in array 300 (as well as gates of low voltage logic transistors and high voltage logic transistors fabricated on the same chip).

Figure 11:
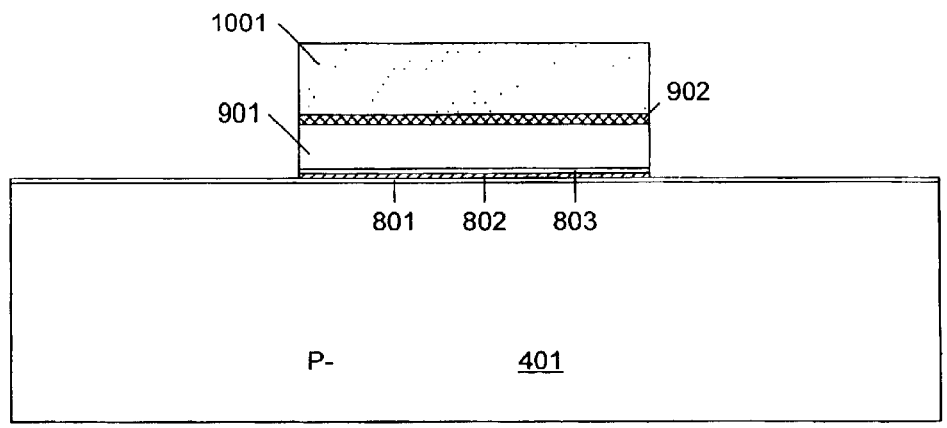
Figure 12:
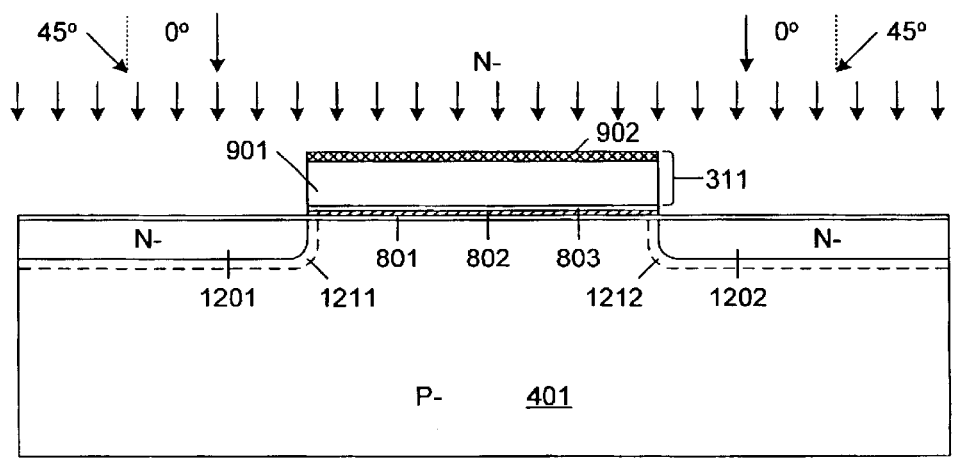

As illustrated in FIG. 11, an etch is then performed to remove the portions of metal silicide layer 902 and polysilicon layer 901 that are exposed by photoresist mask 1001, thereby forming gate electrodes 310–313. In one embodiment, this polycide etch is a dry etch. In the described embodiment, polysilicon layer 901 is etched until about 20–30 Å are etched from upper dielectric layer 803.

Another series of etches is then performed to remove the exposed portions of ONO layer 804. The portions of upper silicon oxide layer 803 and silicon nitride layer 802 that are exposed by photoresist mask 1001 are removed. In one embodiment, these layers are removed by a two step dry etch, which is performed by a low pressure, high density plasma etcher. The first process step removes the exposed portions of upper silicon oxide layer 803. The etch time is calculated to remove all of the exposed portions of upper silicon oxide layer 803, and part of the underlying silicon nitride layer 802. The second process step is an isotropic etch that removes the exposed portions of silicon nitride layer 802. The second etch is selective to oxide, thereby protecting the underlying silicon oxide layer 801. The time of the second etch is long enough to assure complete removal of the exposed portions of silicon nitride layer 802, and the selectivity of the second etch is high enough to assure at least 30–50 Å of lower oxide layer 801 remain. The second etch only partially etches the lower silicon oxide layer 801. Note that the underlying silicon substrate 401 is not exposed through any part of lower silicon oxide layer 801. The resulting structure is illustrated in FIG. 11. After these etch steps are completed, photoresist mask 1001 is stripped.

A first source/drain implant mask (not shown) is then formed over the resulting structure. An N-type impurity, such as arsenic or phosphorous, is then implanted through openings of this first source/drain implant mask. In one embodiment, arsenic is implanted with a dopant density in the range of 1e14 to 1e16 ions/cm² and an implantation energy in the range of 10 to 100 KeV. In one variation, this implant step is performed at a high implant angle in the range of about 0 to 45 degrees. The high angle implant causes the n-type dopant to extend under the edges of gate electrodes 310–313. In another variation, both arsenic and phosphorous can be used in the first source/drain implant. The implanted N-type impurities are illustrated as N type source/drain regions 1201 and 1202 in FIG. 12. These regions are self-aligned with gate electrode 311.

In one variation, p-type implants can also be performed through the first source/drain implant mask. More specifically, a P-type impurity, such as boron (B) or Boron Fluoride ($BF_2$), can be implanted at angles from 0 to 45 degrees. In accordance with one embodiment of the present invention, the P-type impurities are implanted with a dopant density in the range of 5e12 to 1e15 ions/cm², depending on the implantation energy, which is in the range of 10 to 100 KeV. The implanted boron serves to adjust the threshold voltages of the non-volatile memory transistors in array 300. Such implanted p-type impurities are represented by p-type regions 1211 and 1212 in FIG. 12.

Figure 13:
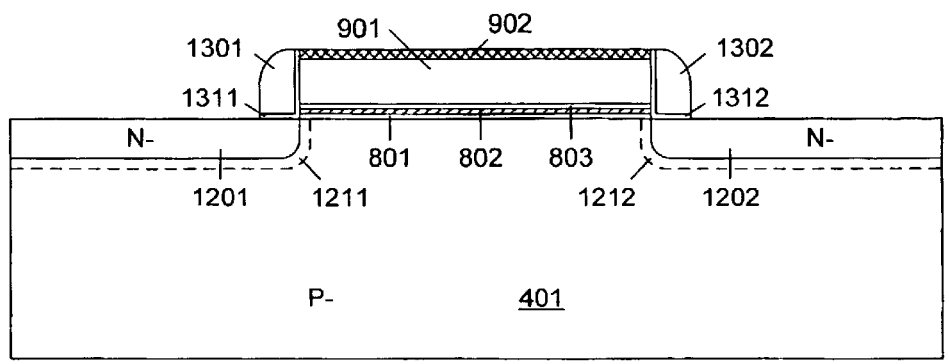

After the first source/drain implants have been performed, sidewall spacers are formed by depositing a thin dielectric layer over the resulting structure, and a thick layer of spacer dielectric material over the thin dielectric layer. The spacer dielectric material is then etched back to form dielectric spacers adjacent to the sidewalls of the gate electrodes 310–313. The resulting sidewall spacers 1301–1302 and corresponding thin dielectric layers 1311–1312 are illustrated in FIG. 13. In one embodiment, the thin dielectric layers 1311–1312 are silicon nitride and the sidewall spacers 1301–1302 are silicon oxide. In another embodiment, the thin dielectric layers 1311–1312 are silicon oxide, and the sidewall spacers 1301–1302 are silicon nitride. In yet other embodiments, the thin dielectric layers 1311–1312 are omitted, and the sidewall spacers 1301–1302 can be either silicon oxide or silicon nitride.

Figure 14:
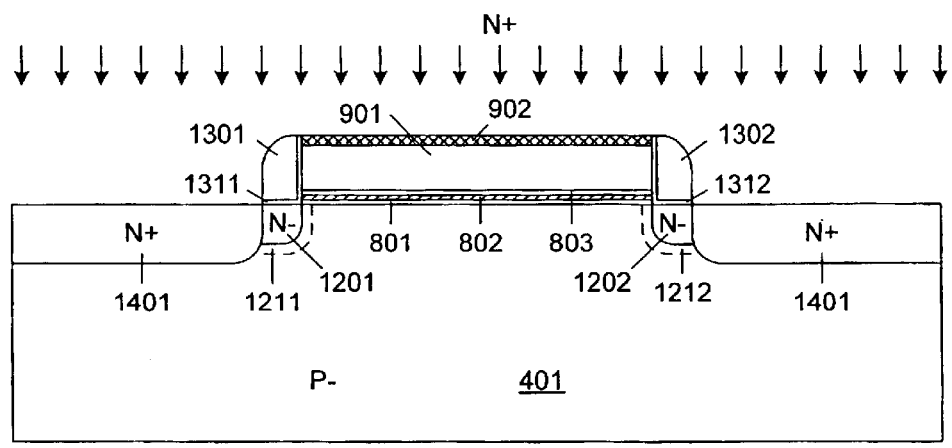

After sidewall spacers 1301–1302 have been formed, an second source/drain implant mask (not shown) is formed over the resulting structure. An N+ implant is then performed by implanting an N-type impurity, such as arsenic or phosphorous, through the second source/drain implant mask, thereby forming N+ type source/drain regions 1401–1402 (FIG. 14). In one embodiment, arsenic is implanted with a dopant density in the range of 1e15 to 1e16 ions/cm² and an implantation energy in the range of 10 to 100 KeV. In one variation, both arsenic and phosphorous can be used in the N+ implant.

Figure 15:
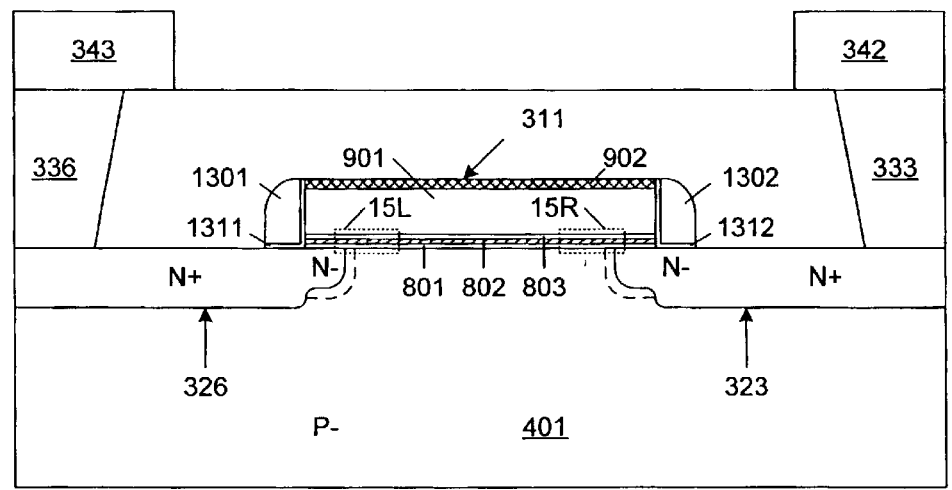

After the N+ implant has been performed, conventional back end processes (inter-metal layer and contact formation) are performed, thereby forming contacts, such as contacts 331–338, metal-1 lines, such as metal-1 bit lines 341–348 and metal-2 lines, such as metal-2 bit lines 611–614. Annealing steps performed during various stages of the process cause first source/drain regions 1201–1202 and second source/drain regions 1401–1402 to be activated, thereby forming source/drain regions 323 and 326 as illustrated in FIG. 15. The left and right charge trapping regions 15L and 15R in floating gate layer 802 of memory transistor $H_{1,1}$ are also illustrated in dashed lines in FIG. 15.

In an alternate embodiment of the present invention, metal silicide layer 902 is not formed over polysilicon layer 902 in the manner described above in connection with FIGS. 9A and 9B. Instead, processing is performed as described above in connection with FIGS. 6–14, but without forming metal silicide layer 902. The resulting structure is illustrated in FIG. 16, wherein similar elements in FIGS. 14 and 16 are labeled with similar reference numbers.

Figure 16:
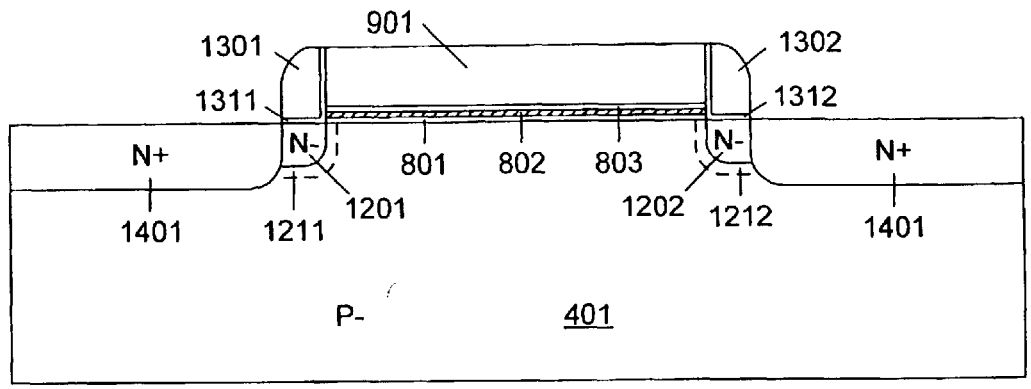
FIGS. 16–18 are cross sectional views the non-volatile memory transistor of FIG. 5, along section line B—B, during various stages of fabrication, when self-aligned salicide is formed over both the word line/control gate and source/drain regions of the non-volatile memory transistor.
Figure 17:
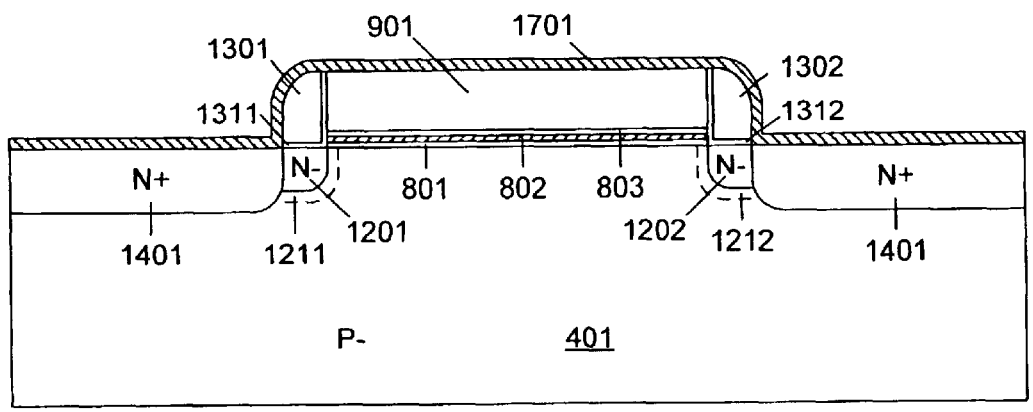
Figure 18:
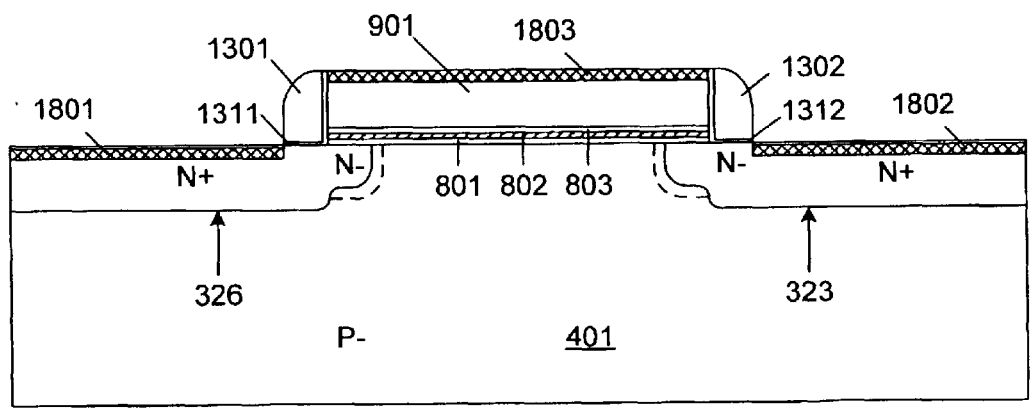

As illustrated in FIG. 17, a blanket layer of a refractory metal, such as titanium and/or cobalt, is blanket deposited over the structure of FIG. 16, thereby forming refractory metal layer 1701. An anneal is then performed, thereby causing refractory metal layer 1701 to react with underlying silicon regions to form metal silicide regions. Thus, the anneal causes metal silicide regions 1801, 1802 and 1803 to be formed over source/drain region 326, source/drain region 323 and polysilicon gate electrode 901, respectively. The portions of refractory metal layer 1701 which overlie sidewall spacers 1301 and 1302 remain unreacted. This anneal also helps to activate the impurities previously implanted in p-well region 401. A refractory metal etching step removes the un-reacted portions of refractory metal layer 1701 thereby leaving self-aligned silicide (i.e., salicide) regions 1801–1803, as illustrated in FIG. 18.

The operation of memory transistor $H_{1,1}$ will now be described.

Program Operation

The right charge trapping region 15R of memory transistor $H_{1,1}$ is programmed in the following manner. Word line 311 is held at a programming voltage of 5–15 Volts, while the word lines 310, 312 and 313 associated with non-selected memory transistors are held at a voltage of 0 Volts. Source/drain region 323 of memory transistor $H_{1,1}$ is maintained at a voltage of 3–10 Volts, and source/drain region 326 of memory transistor $H_{1,1}$ is maintained at a voltage of 0 Volts. Under these conditions, charge is stored in right charge trapping region 15R by hot electron injection. The duration of the programming operation is on the order of microseconds. Note that the duration of the programming operation is not long enough and the applied source/drain voltage of 3–10 Volts is not high enough to cause the non-selected memory transistors to be erased during the programming operation.

The left charge trapping region 15L of memory transistor $H_{1,1}$ is programmed in a similar manner. More specifically, word line 311 is held at a programming voltage of 5–15 Volts, while the word lines 310, 312 and 313 associated with non-selected memory transistors are held at a voltage of 0 Volts. Source/drain region 323 of memory transistor $H_{1,1}$ is maintained at a voltage of 0 Volts, and source/drain region 326 of memory transistor $H_{1,1}$ is maintained at a voltage of 3–10 Volts. Under these conditions, charge is stored in left charge trapping region 15L by hot electron injection. Note that the insulating nature of silicon nitride layer separately maintains the charges stored in the left and right charge trapping regions 15L and 15R.

Read Operation

The right charge trapping region 15R of memory transistor $H_{1,1}$ is read as follows. The word line 311 is maintained at a read voltage of 1.5–5 Volts, while the word lines 310, 312 and 313 are held at a voltage of 0 Volts. Source/drain region 326 is held at a voltage of 0.5–2 Volts, and source/drain region 323 is coupled to a sense amplifier (and held at a voltage of about 0 Volts), such that a reverse read condition exists for the right charge trapping region 15R of memory transistor $H_{1,1}$. Under these conditions, the non-selected memory transistors are neither read nor disturbed.

The left charge trapping region of memory transistor $H_{1,1}$ is read in a similar manner. Word line 311 is maintained at a read voltage of 1.5–5 Volts, while the word lines 310, 312 and 313 are held at a voltage of 0 Volts. Source/drain region 323 is held at a voltage of 0.5–2 Volts, and source/drain region 326 is coupled to a sense amplifier (and held at a voltage of about 0 Volts), such that a reverse read condition exists for the left charge trapping region 15L of memory transistor $H_{1,1}$.

Erase Operation

Memory array 300 is erased as follows. A voltage of 0 to −10 Volts is applied to all of the word lines 310–313 of memory transistor array 300, and an erase voltage of 10 to 0 Volts is applied to all of the bit lines 341–348 (by turning on all of select transistors 601–608). These erase voltages are selected such that charge is removed from all of the charge trapping regions in memory transistors $H_{0,0}$–$H_{3,6}$, thereby erasing these memory transistors.

Advantages

Memory transistor array 300 exhibits the following advantages. First, memory transistor array 300 exhibits a relatively low source/drain series resistance because the source/drain regions are relatively small (when compared with the diffusion bit lines of memory block 100). Memory transistor array 300 also exhibits a relatively low bit line resistance when compared with the diffusion bit lines of memory block 100. This enables memory transistor array 300 to have a relatively large number of rows.

Memory transistors $H_{0,0}$–$H_{3,6}$ also advantageously exhibit a relatively shallow source/drain junction depth (e.g., less than 0.1 microns), because these memory transistors are fabricated largely in accordance with conventional CMOS processing techniques (and do not have the requirement of extending under a bit line oxide region 124, as in memory block 100).

Memory transistors $H_{0,0}$–$H_{3,6}$ are also advantageously able to implement self-aligned salicide on both the word lines 310–313 and the source/drain regions 321–328, when implementing the embodiment illustrated by FIGS. 16–18. The use of self-aligned salicide results in low RC delay and high-speed operation.

Moreover, because field isolation regions are used to isolate the H-shaped source/drain regions, there is minimal leakage between adjacent source/drain regions in memory transistor array 300.

These advantages enable the memory transistor of the present invention to be aggressively scaled (shrunk), thereby providing for a more adaptable and embeddable memory transistor in advanced CMOS technology.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A method of fabricating an array of 2-bit non-volatile memory cells, the method comprising:

forming a plurality of field isolation regions in a semiconductor substrate;

forming a lower dielectric layer over the semiconductor substrate;

forming a floating gate dielectric layer over the lower dielectric layer;

forming an upper dielectric layer over the floating gate dielectric layer;

forming a gate electrode layer over the upper dielectric layer;

patterning the gate electrode layer, the upper dielectric layer and the floating gate dielectric layer, wherein the gate electrode layer is patterned to form a plurality of word line/control gate structures extending along a first axis, and wherein the floating gate dielectric layer is patterned to form a plurality of floating gate structures; and forming H-shaped source/drain regions in the substrate, in alignment with the word line/control gate structures and field isolation regions, the H-shaped source/drain regions having a first conductivity type.

2. The method of claim 1, wherein the step of forming the field isolation regions comprises:

forming trenches in the substrate; and filling the trenches with an insulating material.

3. The method of claim 1, wherein the step of forming the field isolation regions comprises performing local oxidation of silicon (LOCOS) within the substrate.

4. The method of claim 1, wherein the step of forming the lower dielectric layer comprises thermally oxidizing an upper surface of the substrate.

5. The method of claim 1, wherein the step of forming the floating gate dielectric layer comprises depositing a silicon nitride layer over the lower dielectric layer.

6. The method of claim 5, wherein the step of forming the upper dielectric layer comprises thermally oxidizing an upper surface of the floating gate dielectric layer.

7. The method of claim 6, wherein the step of forming the upper dielectric layer further comprises depositing a silicon oxide layer over the floating gate dielectric layer.

8. The method of claim 1, wherein the step of forming the gate electrode layer comprises depositing a polysilicon layer over the upper dielectric layer.

9. The method of claim 8, further comprising doping the polysilicon layer to have the first conductivity type.

10. The method of claim 8, further comprising doping the polysilicon layer to have a second conductivity type, opposite the first conductivity type.

11. The method of claim 8, wherein the step of forming the gate electrode layer further comprises depositing a refractory metal silicide layer over the polysilicon layer.

12. The method of claim 8, wherein the step of forming the gate electrode layer further comprises depositing a refractory metal layer over the polysilicon layer.

13. The method of claim 1, wherein the step of forming the H-shaped source drain regions comprises:

performing a first source/drain implant of the first conductivity type into the substrate in alignment with the word line/control gate structures and field isolation regions;

forming sidewall spacers adjacent to the word line/control gate structures; and then performing a second source/drain implant of the first conductivity type into the substrate in alignment with the sidewall spacers and the field isolation regions.

14. The method of claim 13, wherein the first source/drain implant is performed at a tilt angle greater than 0 degrees.

15. The method of claim 13, further comprising implanting an impurity having a second conductivity type, opposite the first conductivity type, into the substrate in alignment with the word line/control gate structures and field isolation regions.

16. The method of claim 15, wherein the impurity having the second conductivity type is performed at a tilt angle greater than 0 degrees.

17. The method of claim 13, the method further comprising forming self-aligned salicide regions over the word line/control gate structures and the portions of the source/drain regions that are not covered by the sidewall spacers.

* * * * *